United States Patent
Stein et al.

(10) Patent No.: US 7,221,220 B2
(45) Date of Patent: May 22, 2007

(54) METHOD AND APPARATUS FOR LOW-FREQUENCY BYPASS IN BROADBAND RF CIRCUITRY

(75) Inventors: Anatoli B. Stein, Atherton, CA (US); Mikhail Nikolaev, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 112 days.

(21) Appl. No.: 11/146,766

(22) Filed: Jun. 7, 2005

(65) Prior Publication Data

US 2006/0273851 A1    Dec. 7, 2006

(51) Int. Cl.
*H03F 3/68* (2006.01)
(52) U.S. Cl. .................... 330/126; 330/151
(58) Field of Classification Search ............. 330/126, 330/151, 69
See application file for complete search history.

(56) References Cited

U.S. PATENT DOCUMENTS 3,622,898 A * 11/1971 Salmon ................. 330/126
4,284,965 A * 8/1981 Higashi et al. .......... 332/28 T
6,600,388 B2 * 7/2003 Hershtig ................ 333/156
7,049,886 B2 * 5/2006 Kim et al. ............... 330/51

* cited by examiner

*Primary Examiner*—Henry Choe
(74) *Attorney, Agent, or Firm*—Mark G. Lappin; Foley & Lardner LLP

(57) ABSTRACT

A method of processing an input broadband signal in RF circuitry includes extracting low-frequency components from the input broadband signal, processing the low-frequency components in low-frequency bypass circuitry, and adding the processed low-frequency components to the output of the RF circuitry to produce a combined output signal. Low-frequency bypass amplifier circuitry for bypassing RF circuitry includes a capacitor having a first terminal for receiving an input signal and a second terminal for connecting to an input of the RF circuitry, and a differential amplifier having two inputs respectively connected to the two terminals of the capacitor, and an output connected to an output of the RF circuitry. High-frequency components of the input signal pass through the capacitor and the RF circuitry, and low-frequency components pass through the differential amplifier and are added to the output of the RF circuitry to produce a combined output signal. The low-frequency bypass circuitry has an amplification which matches with the amplification of the RF circuitry, such that the combined output signal is not distorted from the input signal.

19 Claims, 2 Drawing Sheets

METHOD AND APPARATUS FOR LOW-FREQUENCY BYPASS IN BROADBAND RF CIRCUITRY

FIELD OF THE INVENTION

The present invention relates to apparatus and methods for low-frequency bypassing in broadband RF circuitry, and more particularly, relates to low-frequency bypass circuitry and methods of low-frequency bypassing an RF circuit.

BACKGROUND OF THE INVENTION

RF circuitry may not work well at low frequency because RF transistors which are built with GaAs or SiGe usually distort low-frequency components in a broadband signal by increasing the level of such low-frequency components with respect to the level of high-frequency components in the broadband signal. Some devices like PIN diodes cannot operate at frequencies below 1 MHz at all because of limited carrier lifetime.

On the other hand, many applications require the electronic elements in a circuit to have the ability to work with broadband signals, often including low-frequency and DC signals. For example, high-bandwidth low-pass filters, amplifiers and filters for NRZ codes as used in disk drives and other magnetic recording devices, as well as amplifiers and filters for the perpendicular recording signals in disk drives and other magnetic recording devices all have to process the broadband signals, which contain a significant amount of low-frequency components, including DC signals.

Therefore, there is a need for a new approach to process broadband signals with limited distortion in low-frequency components of the broadband signals.

SUMMARY OF THE INVENTION

The present invention is directed to methods and apparatus for processing broadband signals in RF circuitry. According to one aspect of the present invention, the method of processing broadband signals in RF circuitry includes extracting low-frequency components, including DC components, from an input broadband signal, processing the low-frequency components in low-frequency bypass circuitry, and adding the processed low-frequency components to the output of the RF circuitry. The extraction and processing of the low-frequency components from the broadband signal are done such a way that after adding the processed low-frequency components to the output of the RF circuitry, the low-frequency part of the signal remains substantially not distorted.

In one preferred form of the present invention, the low-frequency bypass circuitry has an adjustable amplification factor $K_1$, which, in use, is adjusted to match with an amplification factor $K_2$ of the RF circuitry in such a way that $$\frac{K_2}{K_1} R_{in} = R_s + R_{in}$$

where $R_s$ is the output impedance of an input signal source, which is connected to the RF circuitry and generates the input broadband signal, and $R_{in}$ is the input impedance of the RF circuitry.

According to another aspect of the present invention, RF amplifier circuitry includes an RF amplifier having an input and an output, a capacitor C1 having a first terminal for receiving an input broadband signal and a second terminal for coupling (preferably by a capacitor C2) to the input of the RF amplifier, and a differential amplifier having two inputs respectively connected to the two terminals of the capacitor C1, and an output connected to the output of the RF amplifier. The capacitor C1 separates the low-frequency components and the high-frequency components of the input broadband signal, passing the high-frequency components to the RF amplifier and impeding passage of the low-frequency components thereto, while directing the low-frequency components to pass through the differential amplifier. The low-frequency components which are output of the differential amplifier are added to the output of the RF amplifier.

Another preferred embodiment of the present invention is directed to differential RF amplifier circuitry, which includes a differential RF amplifier having two inputs and two outputs (inverted and non-inverted), a first capacitor C3 having a first terminal for connecting to the input signal source and a second terminal for coupling (preferably by a capacitor C4) to one of the inputs of the differential RF amplifier, a first differential amplifier U4 having two inputs respectively connected to the two terminals of the first capacitor C3, and an output connected to the non-inverted output of the differential RF amplifier, a second capacitor C5 having a first terminal for connecting to the input signal source and a second terminal for coupling (preferably by a capacitor C6) to the other input of the differential RF amplifier, and a second differential amplifier U5 having two inputs respectively connected to the two terminals of the second capacitor C5, and an output connected to the inverted output of the differential RF amplifier. In this configuration, the high-frequency components of the input broadband signal pass through the capacitors C3 and C5 and the differential RF amplifier, and low-frequency components of the input broadband signal pass through the differential amplifiers U4 and U5 and are added to the outputs of the RF amplifier. In an alternative form, the differential RF amplifier circuitry may have only one of the capacitors C3 and C5 connected to the input broadband signal source, and the other connected to the ground or other devices.

A further preferred embodiment of the present invention is directed to RF low-pass filter circuitry, which includes a low-pass filter having an input and an output, a capacitor C7 having a first terminal for receiving an input broadband signal and a second terminal for coupling (preferably by a capacitor C8) to the input of the low-pass filter, a differential amplifier having two inputs respectively connected to the two terminals of the capacitor C7, and an output connected to the output of the low-pass filter. In this embodiment, high-frequency components of the input broadband signal pass through the capacitor C7 to the low-pass filter, and low-frequency components of the input broadband signal pass through the differential amplifier and are added to the output of the low-pass filter.

According to one preferred form, the RF low-pass filter circuitry further includes a first PIN diode connected between a capacitor C9, which is connected to the capacitor C8, and the input of the low-pass filter and a second PIN diode connected between the output of the low-pass filter and the ground. The PIN diodes adjust the input impedance and the output impedance of the low-pass filter by applying bias currents to the PIN diodes. Through the adjustments by the PIN diodes, the input and output impedance match to the impedance of the low-pass filter, where, preferably, the input impedance and the output impedance equal to the impedance of the low-pass filter, providing better termination for the low-pass filter. The PIN diodes generally cannot operate below 1 MHz because of the limited carrier lifetime, however, in the illustrated preferred embodiment, the low-frequency components in the input broadband signal are separated by the capacitor C7, pass through the bypass differential amplifier, and are added to the output of the low-pass filter.

According to another preferred embodiment, the RF low-pass filter circuitry further includes a first buffer amplifier connected between the capacitor C7 and the first PIN diode and a second buffer amplifier connected to the output of said low-pass filter. The output of the differential amplifier is added to the output of the second buffer amplifier.

According to another aspect of the present invention, low-frequency bypass amplification circuitry includes a high-frequency channel and a low-frequency channel. The high-frequency channel includes a capacitor, which has an input terminal for connecting to an input signal source, which has an output impedance $R_s$. The high-frequency channel has an input impedance $R_{in}$ and an amplification factor $K_2$. The low-frequency channel includes a differential amplifier having at least one input connected to the input terminal of the capacitor and an output connected to an output of the high-frequency channel. The low-frequency channel has an amplification factor $K_1$. The amplification of the low-frequency channel matches with the amplification of the high-frequency channel in such a way that:

$$\frac{K_2}{K_1} R_{in} = R_s + R_{in}.$$

Preferably, the amplification factor $K_1$ of the low-frequency channel is adjustable, so that, in use, the amplification factor $K_1$ can be adjusted to implement the matches of the amplification of the low-frequency channel and the amplification of the high-frequency channel. In one preferred form, the adjustment of the amplification factor can be implemented by adjusting the resistance of a resistor, which is connected to the output of the differential amplifier, or, in another preferred form, by adjusting the amplification of the differential amplifier, which has an adjustable amplification factor. The amplification of the low-frequency components of the input broadband signal matches the amplification of the high-frequency components, such that the combined output signal is not distorted from the input signal.

DETAILED DESCRIPTION OF THE PREFERRED EMBODIMENTS

Figure 1:
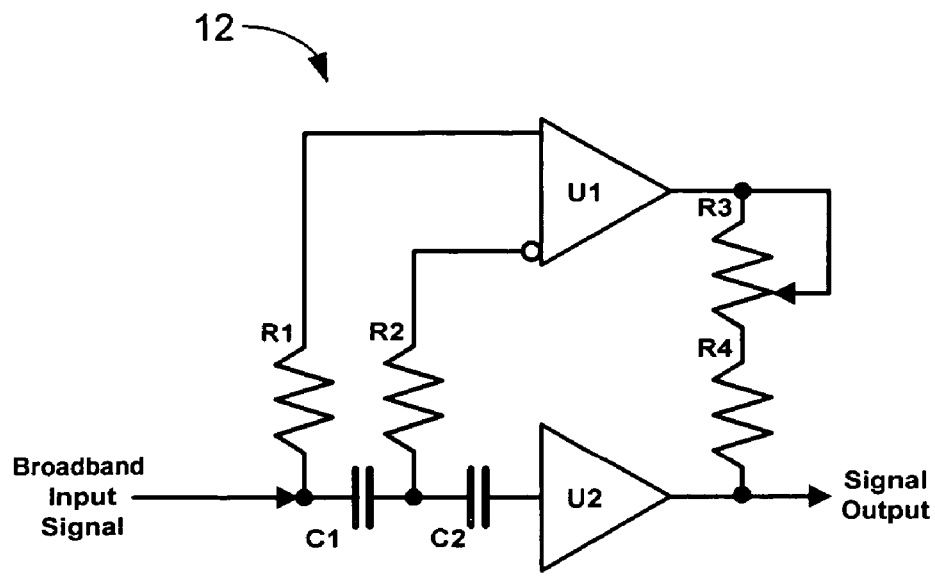
FIG. 1 shows a diagram of RF circuitry having low-frequency bypass circuitry for passage of low-frequency components according to one preferred embodiment of the present invention.

FIG. 1 illustrates a low-frequency bypass circuit coupled to an RF amplifier according to one preferred embodiment of the present invention. Input broadband RF signals are transmitted to the input of the RF amplifier. The low-frequency bypass circuit, which bypasses the RF amplifier, is adapted to pass and process the low-frequency components including DC signals of the input broadband RF signals and add the processed low-frequency components to the output of the RF amplifier.

In one preferred embodiment, the low-frequency bypass circuit, as indicated by number 12, includes two capacitors C1 and C2 connected in series. An end terminal of the capacitor C2 is connected to the input of the RF amplifier, which is denoted by U2. The input broadband RF signal is connected to an terminal of C1 and transmitted through C1 and C2 to the input of the RF amplifier U2. The low-frequency bypass circuit 12 further includes a low-frequency differential amplifier U1 and two resistors R1 and R2 respectively coupled to two inputs of the differential amplifier U1. The two resistors R1 and R2 have their other two terminals respectively connected to two end terminals of the capacitor C1. The output of the differential amplifier U1 is connected to the output of the RF amplifier U2 through one or more resistors (R3 and R4 in FIG. 1), preferably, as shown in FIG. 1, the resistance of which is adjustable. The resistors R1 and R2 preferably have high resistance, isolating high-frequency RF signal path from the low-frequency differential amplifier U1.

The capacitor C1 separates the low-frequency and high-frequency components of the input broadband signal, passing high frequency components to the input of the RF amplifier U2 and impedes the passage of the low-frequency components, which pass through the resistor R1 to the input of the differential amplifier U1. The capacitance of the capacitor C1 is preferably defined by the desired cutoff frequency between the RF amplifier U2 and the differential amplifier U1. For example, to make the cutoff frequency about 10 MHz, passing signals with frequency higher than 10 MHz to the RF amplifier and impeding signals with frequency lower than 10 MHz, the capacitance of the capacitor C1 preferably is about 1000 pF. The capacitor C2 preferably has a higher capacitance, in the range from 0.1 µF to 1 µF, than the capacitor C1. The capacitor C2 isolates the inputs of the differential amplifier U1 from DC voltage, which may appear at the input of the RF amplifier U2. The low-frequency bypass circuit 12 provides a bypass for low-frequency components in the input broadband signal. The high-frequency components in the input broadband signal pass through the RF amplifier U2. The low-frequency components and the high-frequency components are combined at the output of the RF amplifier U2.

Figure 2:
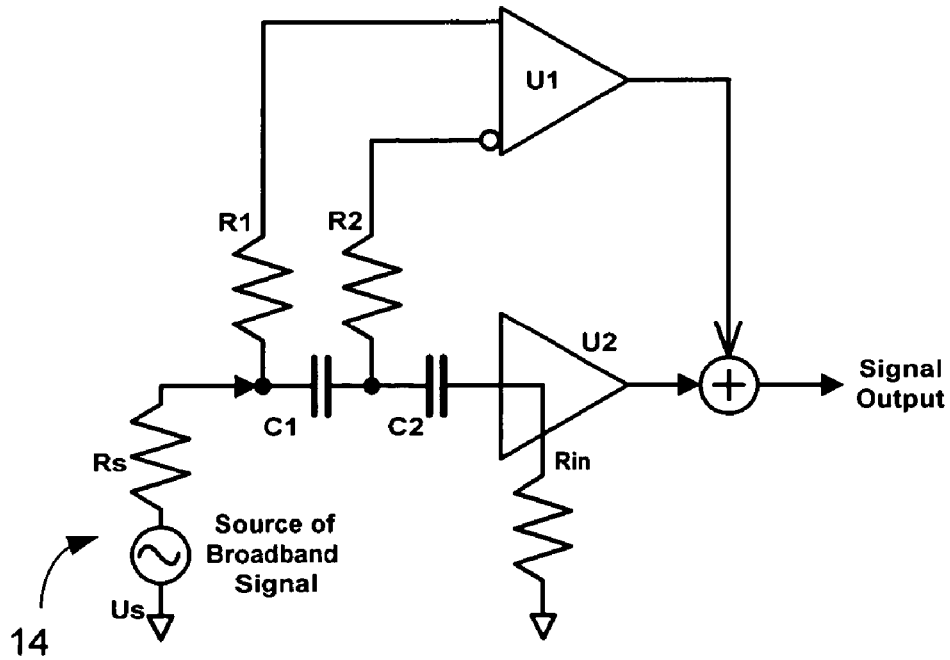
FIG. 2 shows a diagram representing of the RF circuitry in FIG. 1.

FIG. 2 illustrates a circuit diagram, which has the same circuit elements as the circuit in FIG. 1 and is used to illustrate the relationships of the circuit elements in FIG. 1.

In FIG. 2, for illustration purpose, a signal source 14, which generates input broadband signals, is used. The signal source 14 is connected to the capacitor C1. In the following relationship equations:

$U_s$ is the broadband signal source voltage;

$R_s$ is the output impedance of the broadband signal source 14;

$R_{in}$ is the RF amplifier input impedance.

Since the capacitance of the capacitor C1 is far less than the capacitance of the capacitor C2, the voltage $U_{in}$ at the input of the RF amplifier U2 is given by:

$$U_{in} = \frac{U_s R_{in}}{R_s + R_{in} + \frac{1}{jwc_1} + \frac{1}{jwc_2}} \quad (1)$$

$$\approx \frac{U_s R_{in}}{R_s + R_{in} + \frac{1}{jwc_1}}$$

An output voltage $U_{RF}$ at the output of the RF amplifier U2 effected by the input voltage $U_{in}$ is given by:

$$U_{RF} = K_2 \frac{U_s R_{in}}{R_s + R_{in} + \frac{1}{jwc_1}} \quad (2)$$

where $K_2$ is the amplification factor of the RF amplifier U2.

An output voltage $U_{LF}$ at the output of the low-frequency differential amplifier U1 effected by the input voltage $U_{in}$ is given by:

$$U_{LF} = K_1 \frac{U_s}{jwc_1 \left(R_s + R_{in} + \frac{1}{jwc_1}\right)} \quad (3)$$

where $K_1$ is the amplification factor of the differential amplifier U1.

The sum of $U_{RF}$ and $U_{LF}$ gives the combined voltage $U_{out}$ at the output of the RF amplifier U2. The combined voltage $U_{out}$ is given by:

$$U_{out} = U_s \frac{K_2 R_{in} + K_1 \frac{1}{jwc_1}}{R_s + R_{in} + \frac{1}{jwc_1}} \quad (4)$$

The overall amplification factor K of the circuit is given by:

$$K = \frac{U_{out}}{U_s} \quad (5)$$

$$= K_1 \frac{\frac{K_2}{K_1} R_{in} + \frac{1}{jwc_1}}{R_s + R_{in} + \frac{1}{jwc_1}}$$

In a preferred form, the amplification factor of the differential amplifier U1 matches the amplification factor of the RF amplifier U2 in such a way that:

$$\frac{K_2}{K_1} R_{in} = R_s + R_{in} \quad (6)$$

As seen from equations (5) and (6), if the amplification factors $K_1$ and $K_2$ satisfy equation (6), the amplification of the overall circuitry is independent from the radial frequency jw.

If, for example, $R_s = R_{in}$, which is common for 50 Ohm RF amplifiers, then $$\frac{K_2}{K_1} = 2 \quad (7)$$

and $$K = K_1$$
$$= \frac{K_2}{2}$$

It is clear from equitation (7) that matching the amplification factor of the differential amplifier U1 to the amplification factor of the RF amplifier U2 using the approach given by equation (6) provides RF amplifier circuitry with a flat frequency response in the range from DC to a relatively high frequency.

For the circuitry in FIG. 1, the amplification matching in accordance with equation (6) shown in FIG. 6 can be achieved by adjusting the impedance of the adjustable resistor R3, or alternatively, by selecting a differential amplifier with a desired amplification factor $K_1$ or with an adjustable amplification factor, or by other means to adjust amplification factor $K_1$.

The equitation (4) is based on the assumption that delays of the differential amplifier U1 and the RF amplifier U2 are the same. In reality, the delays of the two amplifiers may not equal to each other. But a small difference in delay does not affect the final result, since the cutoff frequency for separation of the low-frequency components from the high-frequency components is relatively low, which, in some embodiments, is about 10 MHz.

Figure 3:
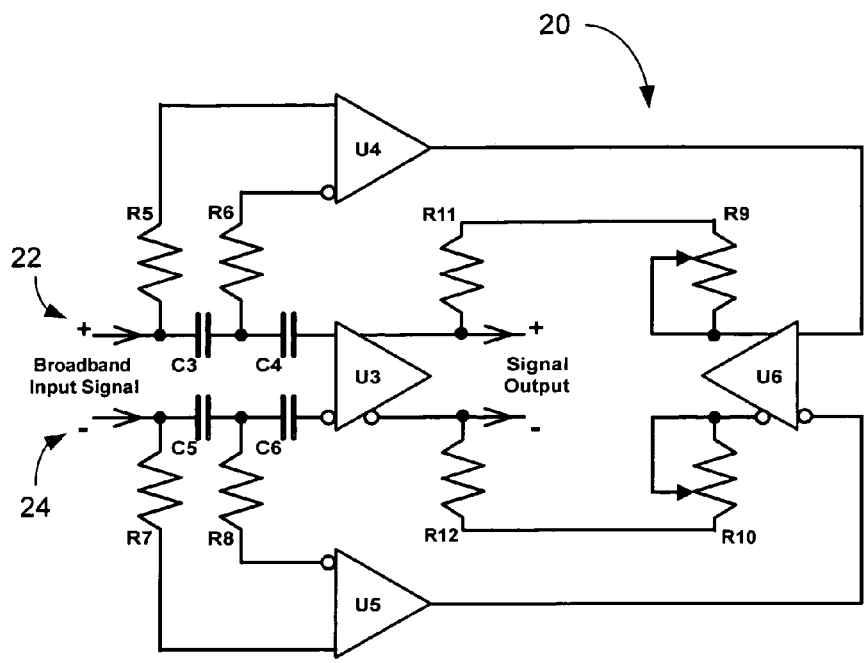
FIG. 3 shows a diagram of differential RF circuitry according to another preferred embodiment of the present invention.

FIG. 3 shows a diagram of differential RF amplifier circuitry embodying one preferred form of the present invention. The differential RF amplifier circuitry, as denoted by number 20, includes two differential inputs 22 and 24. An input broadband signal is connected to the differential inputs 22 and 24 of the differential RF amplifier circuitry 20. The two differential inputs 22 and 24 are connected to two inputs of an RF amplifier U3 respectively through the series capacitor pairs C3, C4 and C5, C6. The capacitance of the capacitors C3, C5 is preferably far less than the capacitance of the capacitors C4, C6. Two end terminals of the capacitor C3 are respectively connected to two inputs of a differential amplifier U4 through two resistors R5 and R6. Two end terminals of the capacitor C5 are respectively connected to two inputs of a differential amplifier U5 through two resistors R7 and R8. The outputs of the differential amplifiers U4 and U5 are connected to two inputs of another low-frequency differential amplifier U6. Two outputs of the differential amplifier U6 are respectively connected to two outputs of the RF amplifier U3 through resistors R9, R11 and resisters R10, R12. The resistance of the resistors R9 and R10 are preferably adjustable to allow matching the amplification of the low-frequency channel, which includes the differential amplifiers U4, U5, U6, and the associated resistors, to the amplification of the high-frequency channel, which includes the capacitors C3,C4 and C5, C6, and the RF amplifier U3. Matching the amplifications of the low-frequency channel and the high-frequency channel can be achieved in other ways, for example, using a differential amplifier with adjustable amplification as the differential amplifier U6 or using differential amplifiers with adjustable amplification as the differential amplifiers U4 and U5.

Similar to the embodiment shown in FIG. 1, the capacitors C3 and C5, which have relatively small capacitance, pass high-frequency components of the input broadband signal to the RF amplifier U3, and impedes the passage of the low-frequency components. The capacitance of the capacitors C3 and C5 can be selected to achieve a desired cutoff frequency between the low-frequency components and the high-frequency components. High-frequency components of the broadband signal pass through the capacitors C3, C4 and C5, C6 to the RF amplifier U3 and is processed by the RF amplifier U3. Low-frequency components of the broadband signal pass through the resistors R5, R6 and R7, R8 to the low-frequency differential amplifiers U4 and U5, and the outputs of the differential amplifiers U4 and U5 pass through the differential amplifier U6 and are combined to the outputs of the RF amplifier U3.

Figure 4:
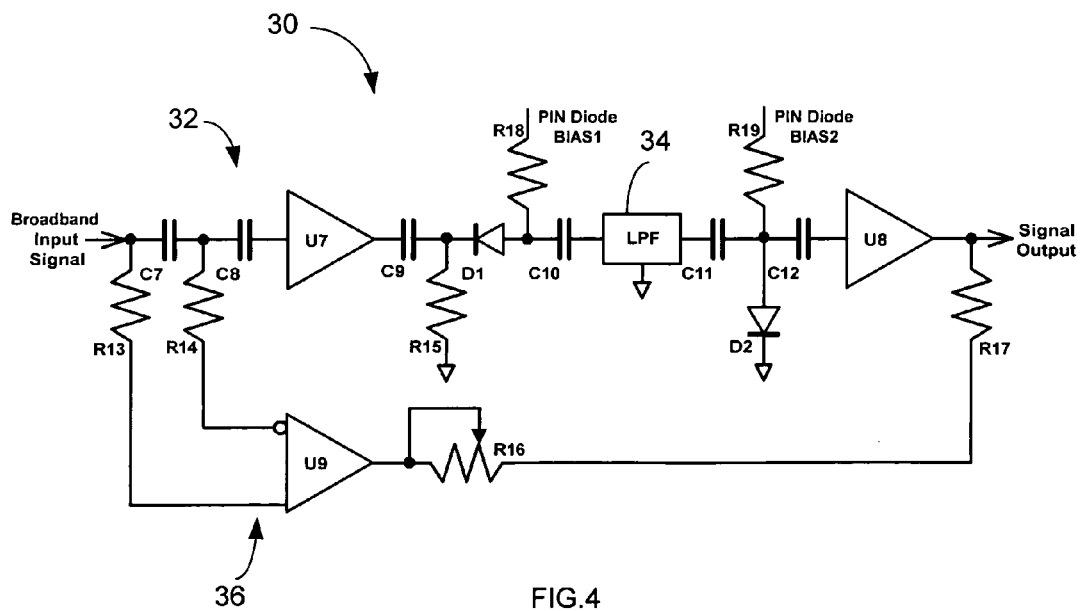
FIG. 4 shows a diagram of low-pass filter circuitry according to a further preferred embodiment of the present invention.

FIG. 4 shows a diagram of low-pass filter (LPF) circuitry 30 embodying another preferred form of the present invention. As seen in FIG. 4, the input broadband signal is connected to a capacitor C7 of a high-frequency channel 32. The capacitor C7 preferably has a relatively small capacitance, allowing high-frequency components to pass to the high-frequency channel 32. The high-frequency channel 32 further includes a first buffer amplifier U7 which is connected to the other terminal of the capacitor C7 through a capacitor C8. The output of the buffer amplifier U7 is connected to one terminal of a capacitor C9. The other terminal of the capacitor C9 is connected to a cathode (n-doped side) of a PIN diode D1. The other terminal of the capacitor C9 is further grounded through a resistor R15. An anode (p-doped side) of the PIN diode D1 is connected to a bias current or voltage through a resistor R18. The p-doped side of the PIN diode D1 is further connected to the input of a low-pass filter (LPF) 34 through a capacitor C10. The output of the low-pass filter 34 is connected to the input of a buffer amplifier U8 through two serially connected capacitors C11 and C12. A common node of the serially connected capacitors C11 and C12 is connected to an anode (p-doped side) of another PIN diode D2, whose cathode (n-doped side) is grounded. The p-doped side of the PIN diode D2 is connected to a bias current or voltage through a resistor R19. Preferably, the capacitors C8, C9, C10, C11 and C12 have a larger capacitance than the capacitor C7.

The low-pass filter (LPF) circuitry 30 further includes a low-frequency channel 36, which includes two resistors R13 and R14 respectively connected to two terminals of the capacitor C7. The other two terminals of the two resistors R13 and R14 are connected to two inputs of a differential amplifier U9. The output of the differential amplifier U9 is connected to the output of the buffer amplifier U8 through an adjustable resistor R16 and a resistor R17, which are connected in series.

The PIN diodes D1 and D2 adjust the input impedance and the output impedance for better termination of the low-pass filter 34. It is important to match these two impedance values to the impedance of the low-pass filter 34, especially if the low-pass filter 34 is tunable and can change its impedance during bandwidth tuning. The adjustments are done by applying the bias current through the resistors R18 and R19 to the PIN diodes D1 and D2.

It is well known that PIN diodes cannot operate below 1 MHz because of the limited carrier lifetime. In the illustrated embodiment, the low-frequency components are separated by the capacitor C7 and added to the output of the buffer amplifier U8 through the low-frequency differential amplifier U9 and the resistors R16, R17; thus the PIN diodes are low-frequency-bypassed by the low-frequency channel. The impedance match typically requires the input impedance and the output impedance of the low-pass filter 34 to be equal. The resistor R16 can be adjusted to match the amplification of the low- and high-frequency channels. The adjustment of the amplification of the low-frequency channel to match the high-frequency channel can also be done by adjusting the amplification of the low-frequency differential amplifier U9.

While the claimed invention has been described in detail and with reference to specific embodiments thereof, it will be apparent to one of ordinary skill in the art that various changes and modifications can be made to the claimed invention without departing from the spirit and scope thereof. Thus, for example those skilled in the art will recognize, or be able to ascertain, using no more than routine experimentation, numerous equivalents to the specific substances and procedures described herein. Such equivalents are considered to be within the scope of this invention, and are covered by the following claims.

What is claimed is:

1. Low-frequency bypass amplifier circuitry for bypassing an RF circuit, said RF circuit having an input and an output, said low-frequency bypass circuitry comprising:

a capacitor C1 having a first terminal for receiving an input signal and a second terminal for connecting to said input of said RF circuit; and a differential amplifier having two inputs respectively connected to said two terminals of said capacitor C1, and an output connected to said output of said RF circuit, wherein high-frequency components of said input signal pass through said capacitor C1 and said RF circuit, and low-frequency components of said input signal pass through said differential amplifier and are added to the output of said RF circuit.

2. Low-frequency bypass amplifier circuitry according to claim 1, wherein said first terminal of said capacitor C1 is connected to one of said two inputs of said differential amplifier through a first resistor, and said second terminal of said capacitor C1 is connected to the other input of said differential amplifier through a second resistor.

3. Low-frequency bypass amplifier circuitry according to claim 1 further comprising a second capacitor C2 connected between said capacitor C1 and said input of said RF circuit.

4. Low-frequency bypass amplifier circuitry according to claim 3, wherein said capacitor C1 has a relatively smaller capacitance than said second capacitor C2.

5. Low-frequency bypass amplifier circuitry according to claim 1, wherein said output of said differential amplifier is connected to said output of said RE circuit through a resistor, wherein said resistor is adjustable in resistance.

6. Low-frequency bypass amplifier circuitry according to claim 1, wherein said RF circuit includes an RF amplifier, wherein said differential amplifier has an amplification factor $K_1$, which matches an amplification factor $K_2$ of the RF amplifier in such a way that:

$$\frac{K_2}{K_1} R_{in} = R_s + R_{in}$$

where $R_s$ is the output impedance of an input signal source, which is connected to said first terminal of said capacitor C1, $R_{in}$ is the input impedance of the RF amplifier.

7. Low-frequency bypass amplifier circuitry according to claim 1, wherein said differential amplifier has an adjustable amplification factor.

8. RF amplifier circuitry comprising:
- an RF amplifier having an input and an output;
- a capacitor C1 having a first terminal for receiving an input signal and a second terminal for connecting to said input of said RF amplifier; and
- a differential amplifier having two inputs respectively connected to said two terminals of said capacitor C1, and an output connected to said output of said RF amplifier,
- wherein high-frequency components of said input signal pass through said capacitor C1 and said RF amplifier, and low-frequency components of said input signal pass through said differential amplifier, and are added to the output of said RF amplifier.

9. RF amplifier circuitry according to claim 8, wherein said first terminal of said capacitor C1 is connected to one of said two inputs of said differential amplifier through a first resistor, and said second terminal of said capacitor C1 is connected to the other input of said differential amplifier through a second resistor.

10. RF amplifier circuitry according to claim 8, further comprising a second capacitor C2 connected between said first capacitor C1 and said input of said RF amplifier.

11. RF amplifier circuitry according to claim 10, wherein said capacitor C1 has a relatively smaller capacitance than said second capacitor C2.

12. RF amplifier circuitry according to claim 8, wherein said output of said differential amplifier is connected to said output of said RF amplifier through a resistor, wherein said resistor is adjustable in resistance.

13. RE amplifier circuitry according to claim 8, wherein said differential amplifier has an amplification factor $K_1$, which matches an amplification factor $K_2$ of the RF amplifier in such a way that:

$$\frac{K_2}{K_1} R_{in} = R_s + R_{in}$$

where $R_s$ is the output impedance of an input signal source, which is connected to said first terminal of said capacitor C1, and $R_{in}$ is the input impedance of the RF amplifier.

14. RF amplifier circuitry according to claim 8, wherein said differential amplifier has an adjustable amplification factor.

15. Low-frequency bypass amplification circuitry comprising:
- a high-frequency channel having a capacitor having an input terminal for connecting to an input signal source, said high-frequency channel having an input impedance $R_{in}$ and a total amplification factor $K_2$;
- a low-frequency channel having a differential amplifier having at least one input connected to the input terminal of the capacitor and an output connected to an output of said high-frequency channel, said low-frequency channel having an amplification factor $K_1$,
- wherein the amplification of the low-frequency channel matches with the amplification of the high-frequency channel in such a way that:

$$\frac{K_2}{K_1} R_{in} = R_s + R_{in}$$

where $R_s$ is the output impedance of an input signal source, which is connected to said input terminal of said capacitor.

16. Low-frequency bypass amplification circuitry according to claim 15, wherein said amplification factor $K_1$ of said low-frequency channel is adjustable.

17. Low-frequency bypass amplification circuitry according to claim 16, wherein said low-frequency channel comprises an adjustable resistor connected to the output of the differential amplifier, wherein said amplification factor $K_1$ is adjustable by adjusting said resistor.

18. Low-frequency bypass amplification circuitry according to claim 16, wherein differential amplifier has an adjustable amplification factor.

19. RF amplifier circuitry according to claim 8 wherein said RF amplifier is configured as a low pass filter.

* * * * *

UNITED STATES PATENT AND TRADEMARK OFFICE
CERTIFICATE OF CORRECTION

PATENT NO. : 7,221,220 B2
APPLICATION NO. : 11/146766
DATED : May 22, 2007
INVENTOR(S) : Anatoli B. Stein and Mikhail Nikolaev It is certified that error appears in the above-identified patent and that said Letters Patent is hereby corrected as shown below:

At Column 8, line 52, please correct Claim 5 to read as follows:
-- connected to said output of said RF circuit through a resistor, --

At Column 8, line 65, please correct Claim 6 to read as follows:
-- where $R_S$ is the output impedance of an input signal source, --

At Column 8, line 52, please correct Claim 8 to read as follows:
-- connected to said output of said RF circuit through a resistor, --

At Column 9, line 34, please correct Claim 13 to read as follows:
-- RF amplifier circuitry according to claim 8, wherein --

Signed and Sealed this

Fourth Day of September, 2007

JON W. DUDAS
*Director of the United States Patent and Trademark Office*